(12) United States Patent
Taniguchi et al.

(10) Patent No.: US 10,333,194 B2
(45) Date of Patent: Jun. 25, 2019

(54) ELECTRONIC DEVICE

(71) Applicant: Murata Manufacturing Co., Ltd., Nagaokakyo-shi, Kyoto-fu (JP)

(72) Inventors: Katsumi Taniguchi, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 8 days.

(21) Appl. No.: 15/464,399

(22) Filed: Mar. 21, 2017

(65) Prior Publication Data

US 2017/0194687 A1   Jul. 6, 2017

Related U.S. Application Data

(63) Continuation of application No. PCT/JP2015/075676, filed on Sep. 10, 2015.

(30) Foreign Application Priority Data

Sep. 30, 2014 (JP) .................................. 2014-199527
Jun. 8, 2015 (JP) .................................. 2015-115913

(51) Int. Cl.
*H01P 3/08* (2006.01)
*H05K 1/02* (2006.01)
(Continued)

(52) U.S. Cl.
CPC ........... *H01P 3/081* (2013.01); *H05K 1/0245* (2013.01); *H01P 3/082* (2013.01); *H01P 5/028* (2013.01); *H01P 5/085* (2013.01)

(58) Field of Classification Search
CPC . H01P 3/08; H01P 3/085; H01P 3/088; H05K 1/0251
(Continued)

(56) References Cited

U.S. PATENT DOCUMENTS

2012/0097433 A1  4/2012  Kato et al.
2013/0127560 A1  5/2013  Kato et al.
(Continued)

FOREIGN PATENT DOCUMENTS

JP   2007-214655 A   8/2007
JP   4962660 B2   6/2012
(Continued)

OTHER PUBLICATIONS

Official Communication issued in International Patent Application No. PCT/JP2015/075676, dated Nov. 10, 2015.

*Primary Examiner* — Stephen E. Jones
(74) *Attorney, Agent, or Firm* — Keating & Bennett, LLP

(57) ABSTRACT

An electronic device includes a high-frequency transmission line member and a housing. The high-frequency transmission line member includes a flexible substrate, a signal conductor, and a ground conductor along the signal conductor. The housing is defined by a member separate from the high-frequency transmission line member and located at one principal surface side of the high-frequency transmission line member. The high-frequency transmission line member includes a first portion along the housing to face the housing, and a second portion spaced apart from the housing more than the first portion. The ground conductor is not provided at one principal surface side of the signal conductor in the first portion and is provided at least in the second portion.

20 Claims, 12 Drawing Sheets

(51) Int. Cl.
  *H01P 5/02*    (2006.01)
  *H01P 5/08*    (2006.01)
(58) Field of Classification Search
  USPC .................................... 333/238, 246, 1, 4, 5
  See application file for complete search history.

(56) References Cited

U.S. PATENT DOCUMENTS

2014/0176264 A1* 6/2014 Tago .................... H05K 1/0225
                                                    333/238
2014/0176266 A1* 6/2014 Kato ........................ H01P 3/08
                                                    333/238
2015/0351222 A1  12/2015 Baba et al.

FOREIGN PATENT DOCUMENTS

WO      2012/074101 A1    6/2012
WO      2014/156422 A1   10/2014

* cited by examiner

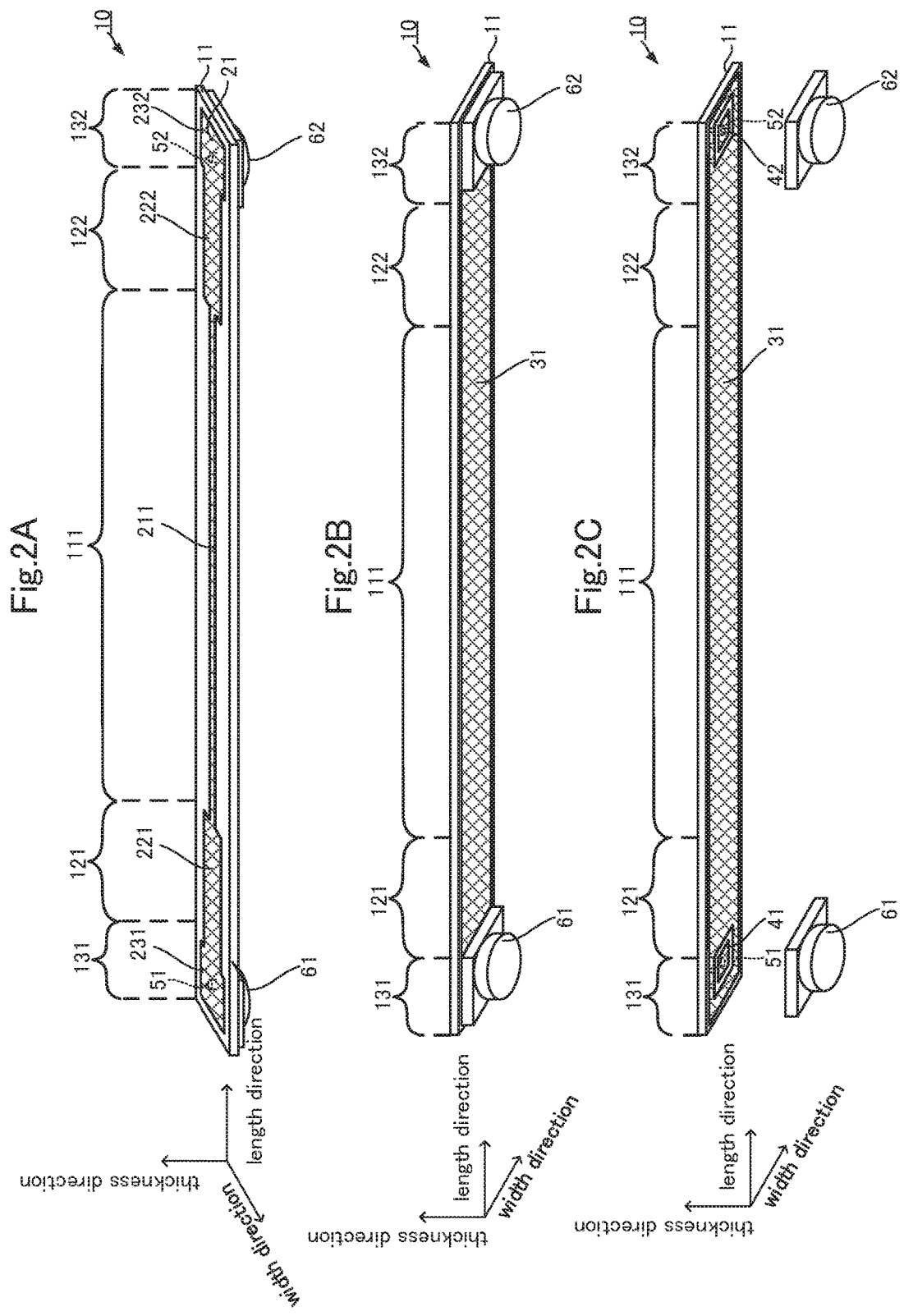

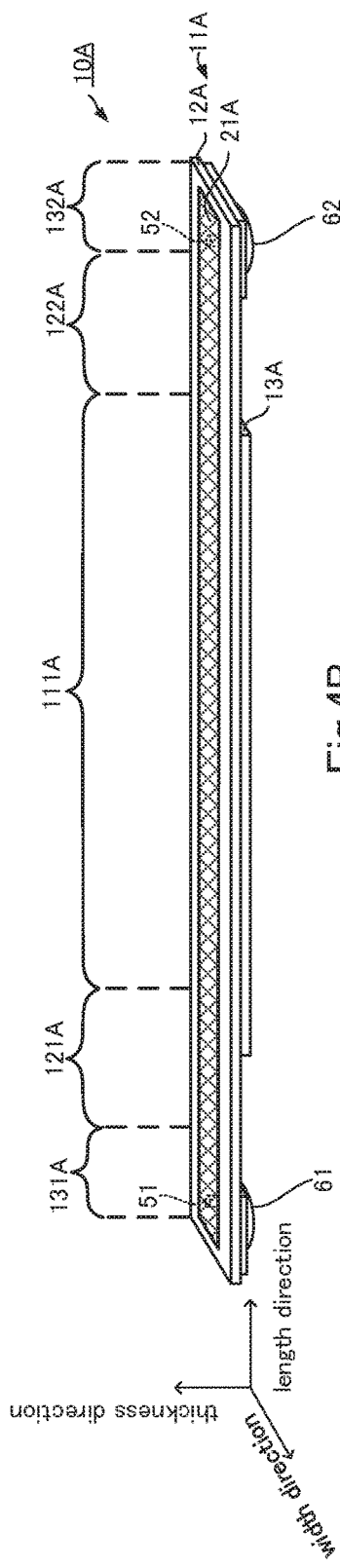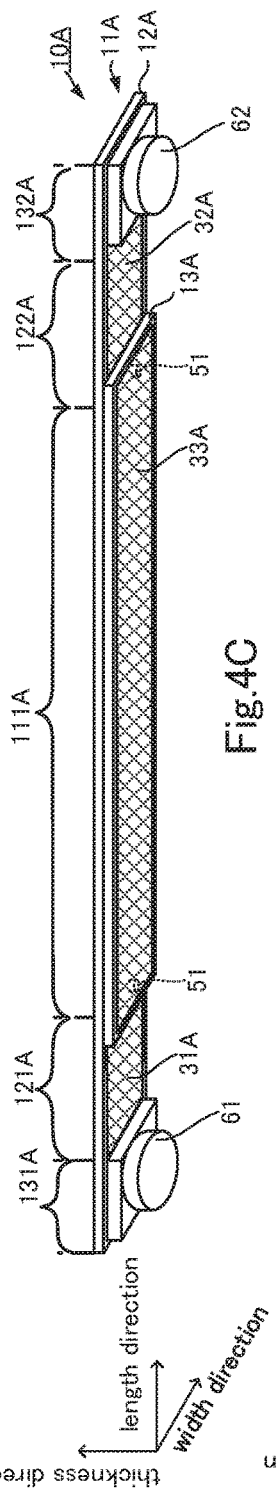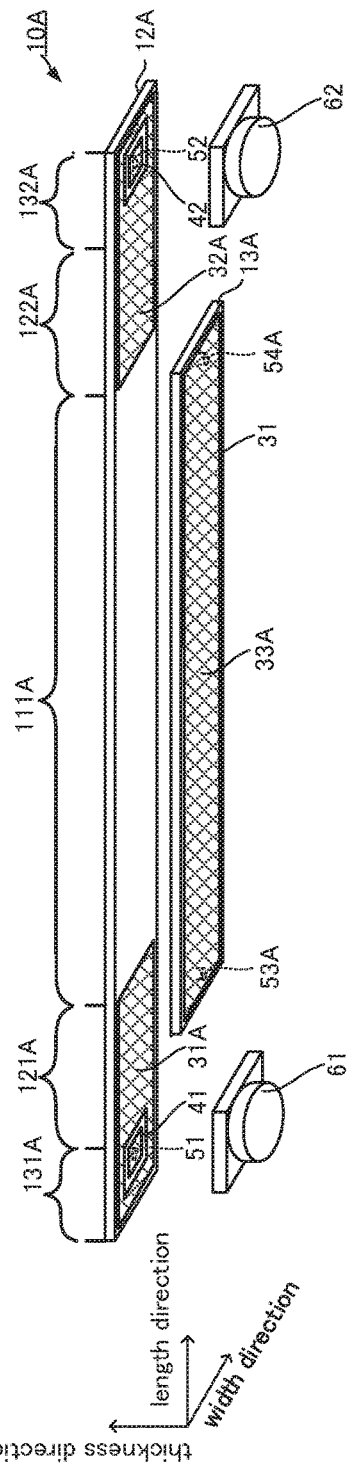

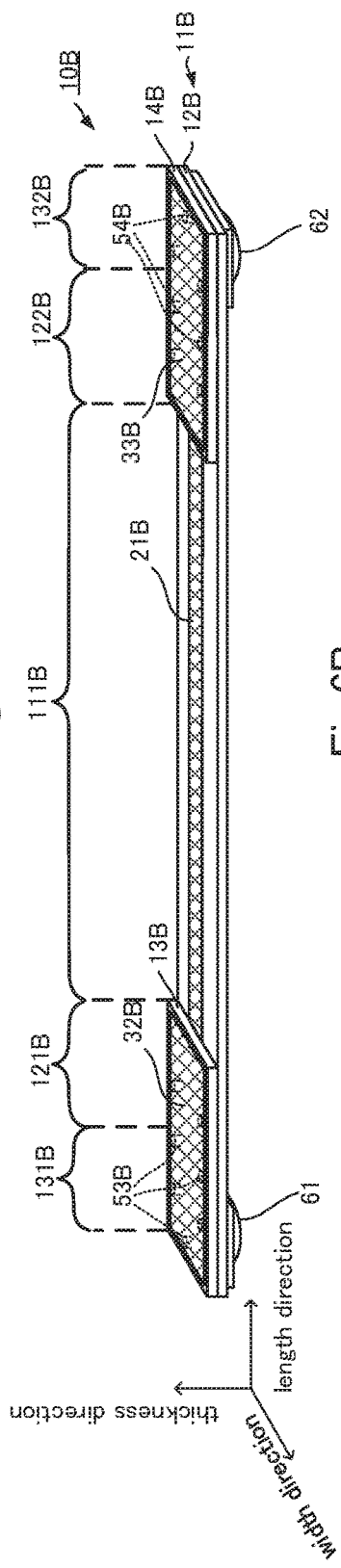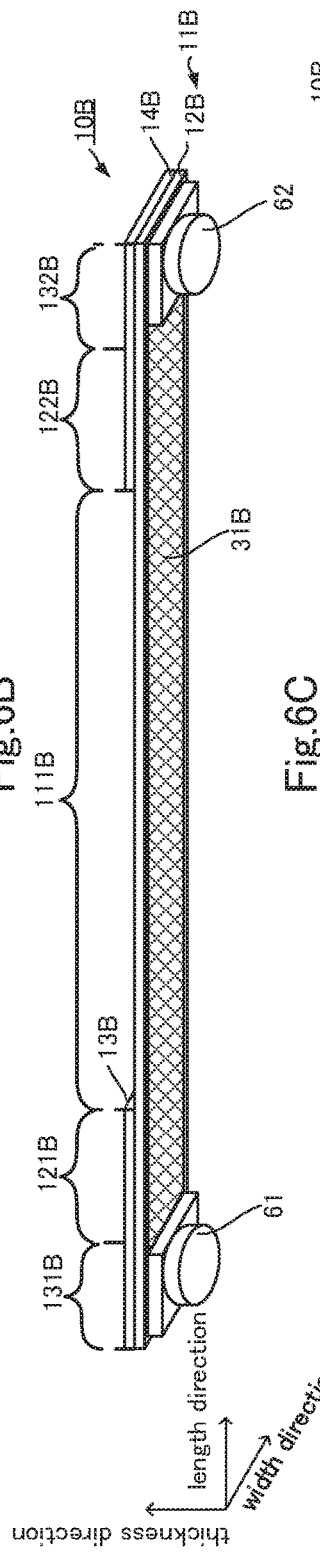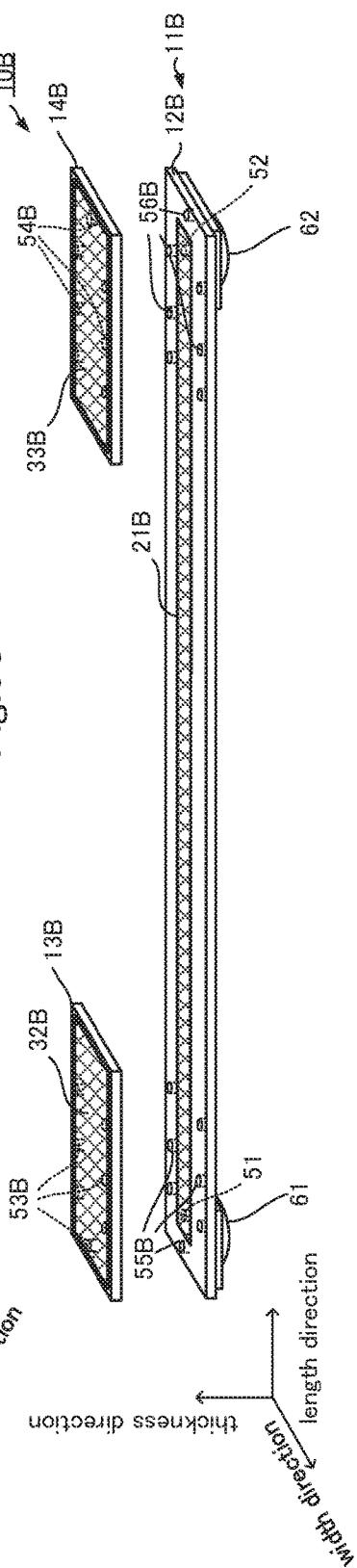

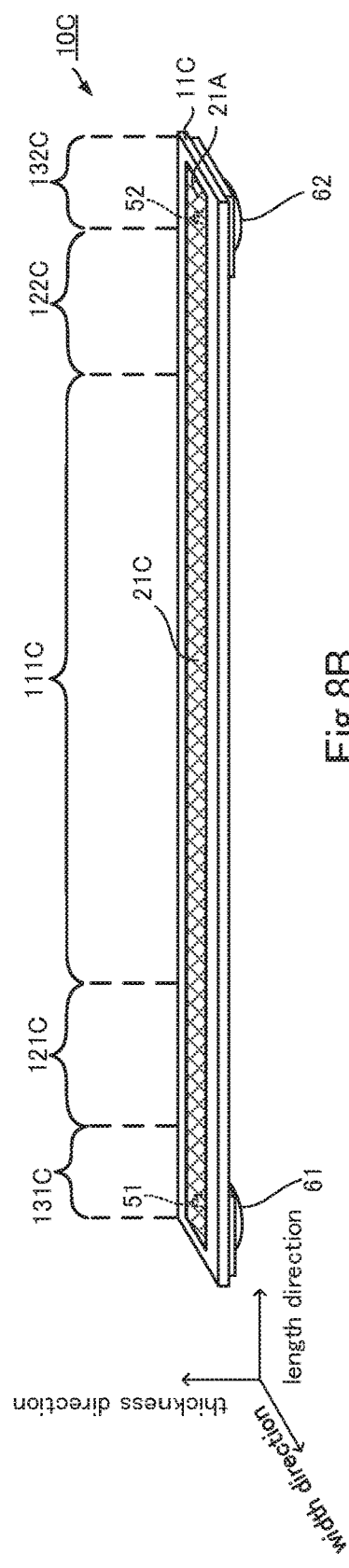
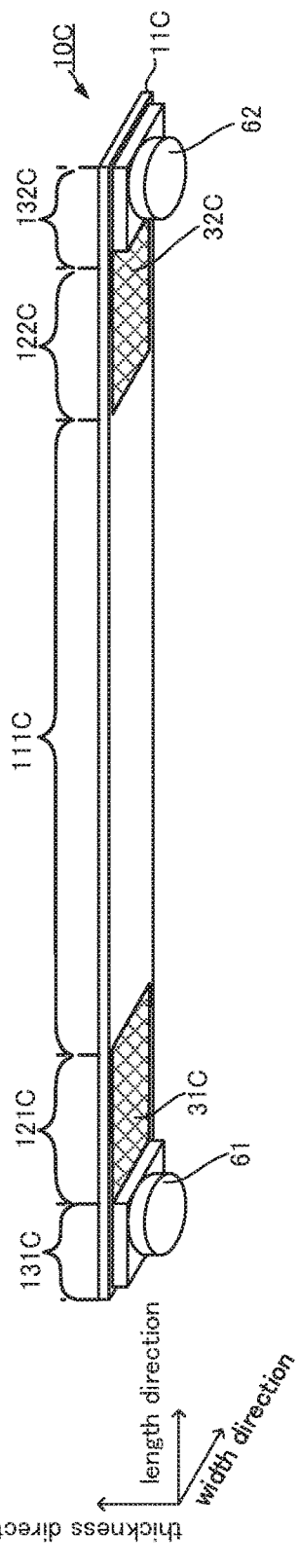

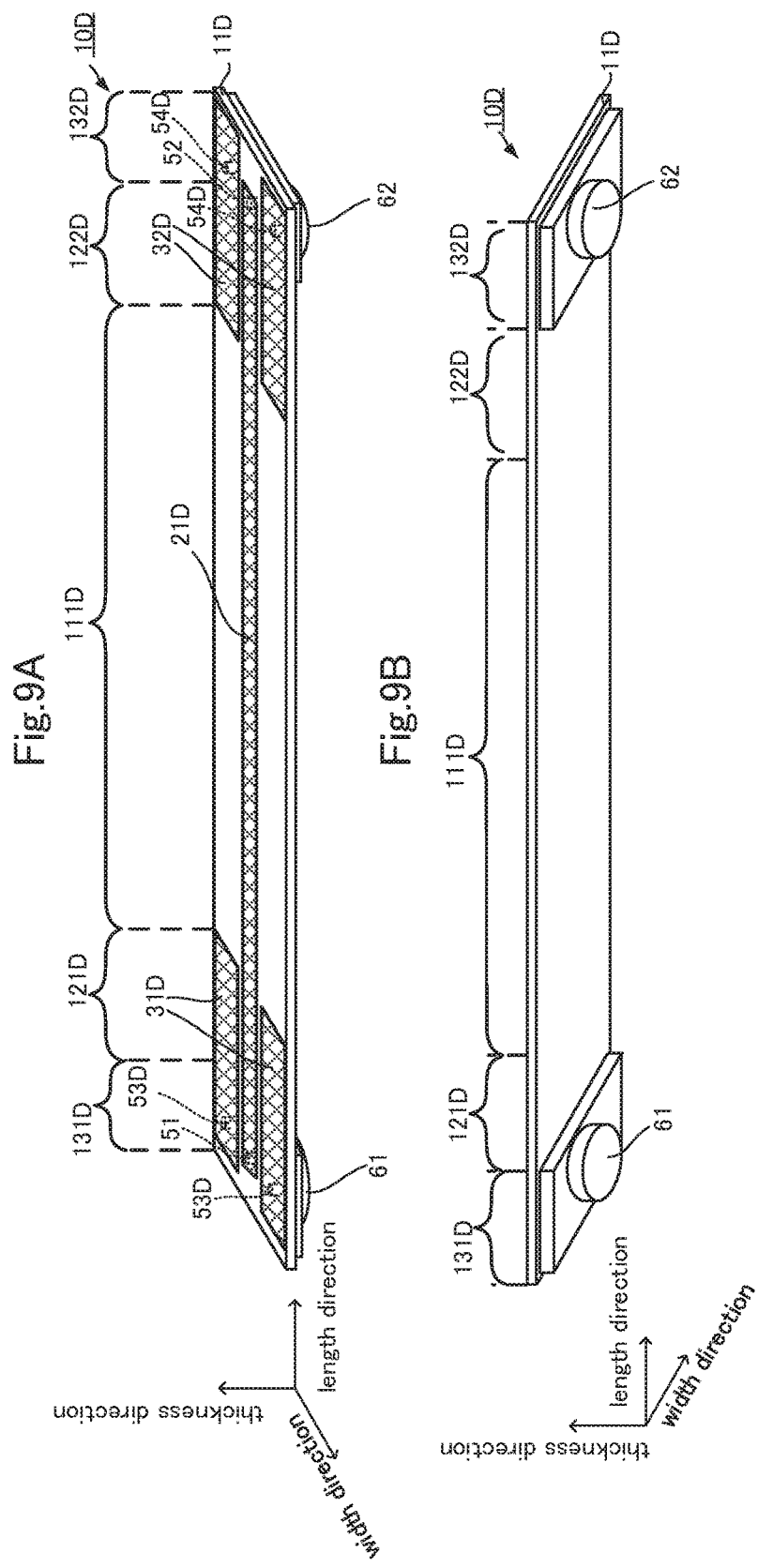

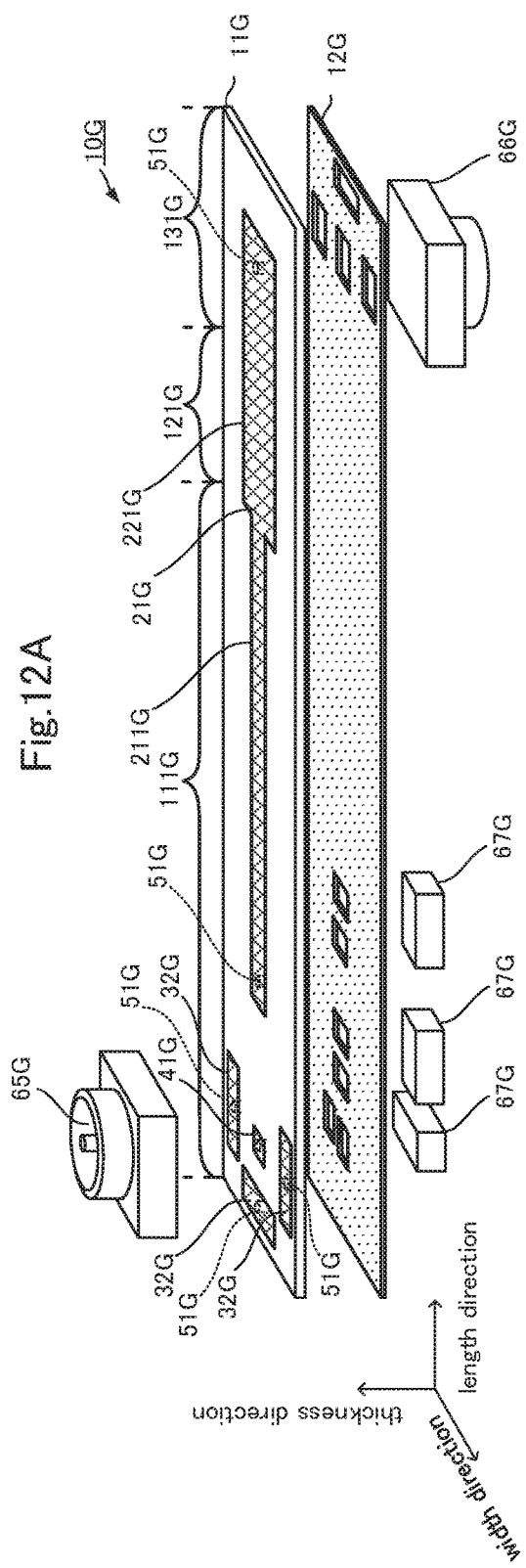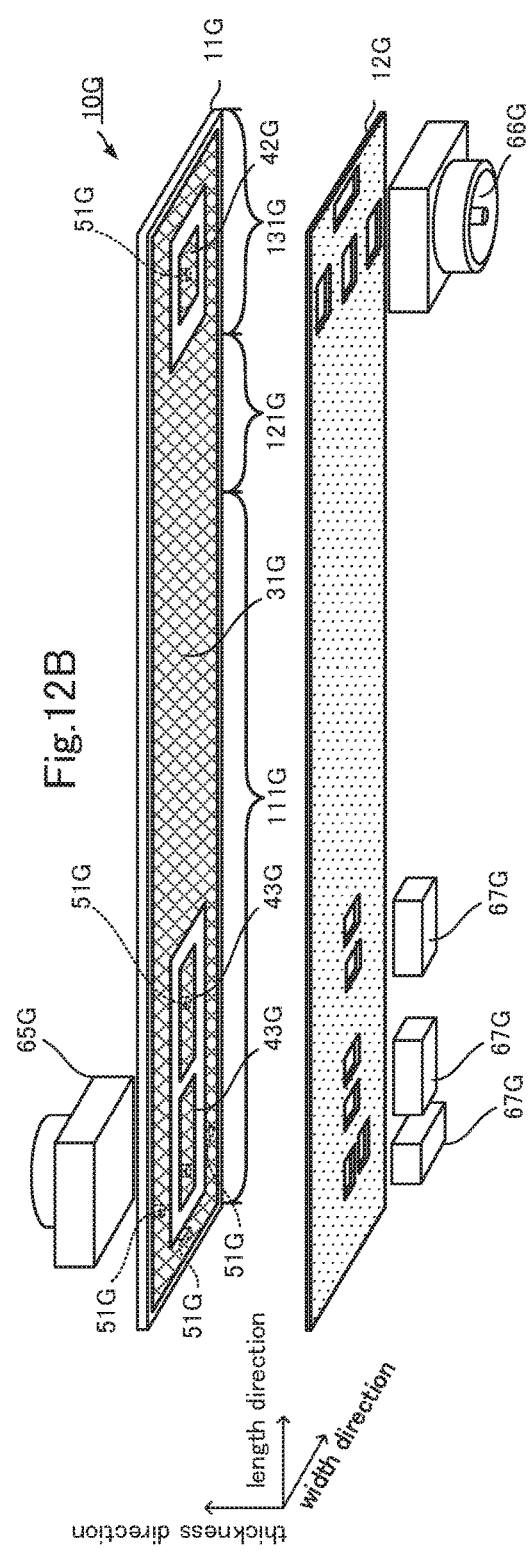

ELECTRONIC DEVICE

CROSS REFERENCE TO RELATED APPLICATIONS

This application claims the benefit of priority to Japanese Patent Application No. 2014-199527 filed on Sep. 30, 2014 and Japanese Patent Application No. 2015-115913 filed on Jun. 8, 2015 and is a Continuation Application of PCT Application No. PCT/JP2015/075676 filed on Sep. 10, 2015. The entire contents of each application are hereby incorporated herein by reference.

BACKGROUND OF THE INVENTION

1. Field of the Invention

The present invention relates to a high-frequency transmission line member that defines a high-frequency transmission line, and an electronic device.

2. Description of the Related Art

A stripline or micro stripline high-frequency transmission line may be provided in or on a flexible substrate or a flat cable having flexibility. A conventional stripline high-frequency transmission line (see, e.g., Japanese Patent No. 4962660) includes a signal conductor disposed at an intermediate position in the thickness direction of an insulating substrate; and two ground conductors disposed with the signal conductor interposed therebetween in the thickness direction of the insulating substrate. The micro stripline high-frequency transmission line includes a signal conductor disposed on one principal surface of an insulating substrate; and one ground conductor disposed at the other principal surface side of the insulating substrate.

SUMMARY OF THE INVENTION

Preferred embodiments of the present invention are able to reduce a thickness of a high-frequency transmission line member defining a high-frequency transmission line, and an electronic device including the thinned high-frequency transmission line member.

According to a preferred embodiment of the present invention, an electronic device includes a high-frequency transmission line member and a metallic member. The high-frequency transmission line member includes a substrate including an insulating layer, a planar signal conductor provided on a surface of the insulating layer and that transmits a high-frequency signal, and a planar ground conductor along the signal conductor and connected to a ground potential. The metallic member is defined by a member separate from the high-frequency transmission line member and located at one principal surface side of the high-frequency transmission line member. The high-frequency transmission line member includes a first portion disposed along the metallic member so as to face the metallic member, and a second portion spaced apart from the metallic member more than the first portion. The ground conductor is not provided at the one principal surface side of the signal conductor in the first portion and is provided at least in the second portion. The signal conductor generates a capacitance together with the metallic member at least in the first portion.

In this configuration, in the second portion of the high-frequency transmission line member, a high-frequency transmission line is defined by the signal conductor extending along the ground conductor. In addition, in the first portion of the high-frequency transmission line member, a high-frequency transmission line is defined by the metallic member located at least at the one principal surface side of the signal conductor and the metallic member defining and functioning as a ground conductor. Since it is not necessary to provide a ground conductor at the one principal surface side of the signal conductor in the first portion of the high-frequency transmission line member, it is possible to reduce the thickness of the high-frequency transmission line member.

In an electronic device according to a preferred embodiment of the present invention, the signal conductor preferably includes a narrower conductor width in the first portion than in the second portion. Thus, it is possible to prevent a capacitance in the first portion from being excessive as compared to a capacitance in the second portion. Accordingly, it is possible to prevent a characteristic impedance of the first portion from being significantly different from that of the second portion, so that it is possible to prevent transmission loss from increasing.

In an electronic device and a high-frequency transmission line member according to preferred embodiments of the present invention, the ground conductor is preferably provided at the other principal surface side of the signal conductor in both the first portion and the second portion, and an interval between the signal conductor and the ground conductor provided at the other principal surface side of the signal conductor is narrower in the second portion than in the first portion. With this configuration as well, it is possible to prevent the capacitance in the first portion from being excessive as compared to the capacitance in the second portion.

In an electronic device and a high-frequency transmission line member according to preferred embodiments of the present invention, the ground conductor is preferably provided at the one principal surface side and the other principal surface side of the signal conductor in the second portion. With this configuration as well, it is possible to prevent the capacitance in the first portion from being excessive as compared to the capacitance in the second portion.

Preferably, an electronic device according to a preferred embodiment of the present invention further includes a facing member facing the other principal surface side of the high-frequency transmission line member, the high-frequency transmission line member being attached to the facing member, and the first portion and the metallic member face each other with a space therebetween. With this configuration, it is possible to make the interval between the signal conductor and the metallic member in the first portion less likely to vary.

Preferably, an electronic device according to a preferred embodiment of the present invention further includes an attaching member attached between the first portion and the metallic member, and the attaching member has a structure that partially defines a space between the first portion and the metallic member. With this configuration as well, it is possible to keep the interval between the signal conductor and the metallic member constant, and it is possible to reduce a capacitance generated between the signal conductor and the metallic member by providing the attaching member with a space. Accordingly, it is possible to increase the line width of the signal conductor to reduce transmission loss.

A high-frequency transmission line member according to a preferred embodiment of the present invention includes a high-frequency transmission line member including a substrate including an insulating layer, a planar signal conductor provided on a surface of the insulating layer and that transmits a high-frequency signal, and a planar ground conductor facing the signal conductor and connected to a ground potential. The high-frequency transmission line member includes a first portion and a second portion in which arrangement of at least one of the signal conductor and the ground conductor is different in a cross-section seen from a direction in which the signal conductor extends, and the ground conductor is not provided at the one principal surface side of the signal conductor in the first portion and is provided at least in the second portion.

In this configuration, when the metallic member of the electronic device is disposed at the one principal surface side of the first portion of the high-frequency transmission line member, it is possible to provide a high-frequency transmission line in the first portion and the second portion. Since it is not necessary to provide a ground conductor at the one principal surface side of the signal conductor in the first portion of the high-frequency transmission line member, it is possible to reduce the thickness.

According to preferred embodiments of the present invention, it is possible to provide a stripline or micro stripline high-frequency transmission line by using the thinned high-frequency transmission line member and the metallic member of the electronic device.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is an external perspective view of one principal surface side of a high-frequency transmission line member according to the first preferred embodiment of the present invention.

FIG. 2B is an external perspective view of the other principal surface side of the high-frequency transmission line member according to the first preferred embodiment of the present invention.

FIG. 2C is an exploded perspective view of the other principal surface side of the high-frequency transmission line member according to the first preferred embodiment of the present invention.

FIG. 4A is an external perspective view of one principal surface side of a high-frequency transmission line member according to a second preferred embodiment of the present invention.

FIG. 4B is an external perspective view of the other principal surface side of the high-frequency transmission line member according to the second preferred embodiment of the present invention.

FIG. 4C is an exploded perspective view of the other principal surface side of the high-frequency transmission line member according to the second preferred embodiment of the present invention.

FIG. 6A is a perspective view of one principal surface side of a high-frequency transmission line member according to a third preferred embodiment of the present invention.

FIG. 6B is an external perspective view of the other principal surface side of the high-frequency transmission line member according to the third preferred embodiment of the present invention.

FIG. 6C is an exploded perspective view of the other principal surface side of the high-frequency transmission line member according to the third preferred embodiment of the present invention.

FIG. 8A is an external perspective view of one principal surface side of a high-frequency transmission line member according to a fourth preferred embodiment of the present invention.

FIG. 8B is an external perspective view of the other principal surface side of the high-frequency transmission line member according to the fourth preferred embodiment of the present invention.

FIG. 9A is an external perspective view of one principal surface side of a high-frequency transmission line member according to a modification of a preferred embodiment of the present invention.

FIG. 9B is an external perspective view of the other principal surface side of the high-frequency transmission line member according to the modification of a preferred embodiment of the present invention.

FIG. 12A is an exploded perspective view of one principal surface side of the high-frequency transmission line member according to the sixth preferred embodiment of the present invention.

FIG. 12B is an exploded perspective view of the other principal surface side of the high-frequency transmission line member according to the sixth preferred embodiment of the present invention.

DETAILED DESCRIPTION OF THE PREFERRED EMBODIMENTS

Hereinafter, a plurality of preferred embodiments of the present invention will be described. The configuration of each portion shown in each preferred embodiment may be interchanged with the configuration of each portion in another preferred embodiment.

First Preferred Embodiment

Figure 1:
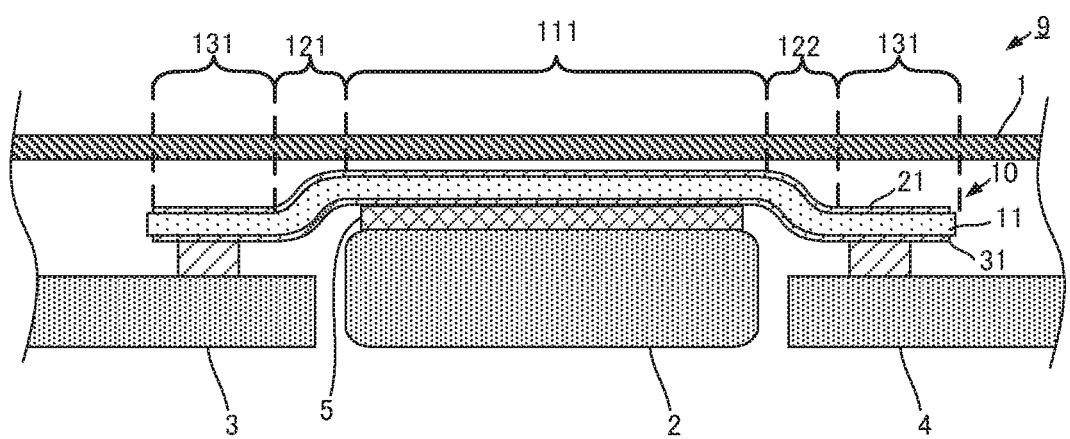
FIG. 1 is a partial cross-sectional view of an electronic device according to a first preferred embodiment of the present invention.

First, an electronic device 9 and a high-frequency transmission line member 10 according to a first preferred embodiment of the present invention will be described with reference to the drawings. FIG. 1 is a partial cross-sectional view of the electronic device 9.

The electronic device 9 preferably includes a housing 1, a built-in module 2, built-in substrates 3 and 4, an attaching member 5, and the high-frequency transmission line member 10.

The built-in module 2 and the built-in substrates 3 and 4 are arranged within the housing 1 so as to be aligned in a direction parallel or substantially parallel to an inner wall of the housing 1 and each face the inner wall of the housing 1. The built-in module 2 is disposed between the built-in substrate 3 and the built-in substrate 4. The high-frequency transmission line member 10 is preferably defined by a flat cable (flexible substrate) having flexibility, is disposed in a gap between the inner wall of the housing 1 and the built-in module 2 and the built-in substrates 3 and 4, and is connected to the built-in substrate 3 and the built-in substrate 4 in a state where both end portions of the frequency transmission line member 10 are bent. The attaching member 5 is attached to the high-frequency transmission line member 10 and the built-in module 2 to fix the high-frequency transmission line member 10 to the built-in module 2.

The housing 1 is preferably made of a metallic material and is disposed at one principal surface side of the high-frequency transmission line member 10. Therefore, the housing 1 defines a metallic member. In addition, the built-in module 2 is disposed at the other principal surface side of the high-frequency transmission line member 10. Therefore, the built-in module 2 defines a facing member.

In the high-frequency transmission line member 10, a portion facing the built-in module 2 preferably extends in the direction parallel or substantially parallel to the inner wall of the housing 1, portions before both end portions are bent in the direction away from the housing 1, and both end portions extend in the direction parallel or substantially parallel to the inner wall of the housing 1 again. The high-frequency transmission line member 10 installed in the electronic device 9 in this manner includes a first portion 111, second portions 121 and 122, and third portions 131 and 132 as a plurality of portions whose bent states are different from each other.

The first portion 111 is a portion that is disposed between the inner wall of the housing 1 and the built-in module 2 to be adjacent to the inner wall of the housing 1 and extending parallel or substantially parallel to the inner wall of the housing 1. The second portion 121 is a portion that is connected to one end side (an end side connected to the built-in substrate 3) of the first portion 111 and is bent from the first portion 111 to the other principal surface side (the built-in module 2 side) to be greatly separated from the inner wall of the housing 1. The second portion 122 is a portion that is connected to the other end side (an end side connected to the built-in substrate 4) of the first portion 111 and is bent from the first portion 111 to the other principal surface side (the built-in module 2 side) to be greatly separated from the inner wall of the housing 1. The third portion 131 is a portion that is connected to one end side (an end side connected to the built-in substrate 3) of the second portion 121, extends parallel or substantially parallel to the inner wall of the housing 1 at a position greatly separated from the inner wall of the housing 1, and is connected to the built-in substrate 3. The third portion 132 is a portion that is connected to the other end side (an end side connected to the built-in substrate 4) of the second portion 122, extends parallel or substantially parallel to the inner wall of the housing 1 at a position greatly separated from the inner wall of the housing 1, and is connected to the built-in substrate 4.

Next, the detailed configuration of the high-frequency transmission line member 10 in a single body state will be described.

FIG. 2A is an external perspective view of the one principal surface side of the high-frequency transmission line member 10. FIG. 2B is an external perspective view of the other principal surface side of the high-frequency transmission line member 10. FIG. 2C is an exploded perspective view of the other principal surface side of the high-frequency transmission line member 10.

Figure 3A:
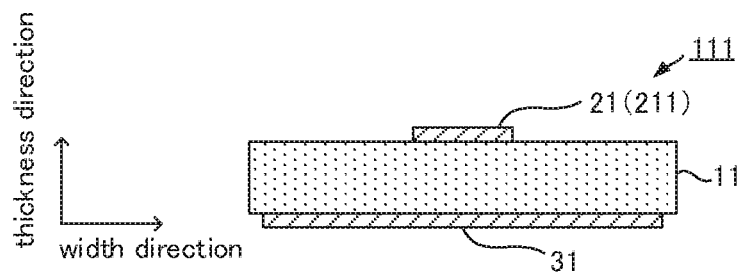
FIGS. 3A to 3C are cross-sectional views of the high-frequency transmission line member according to the first preferred embodiment of the present invention as seen from a length direction.
Figure 3B:
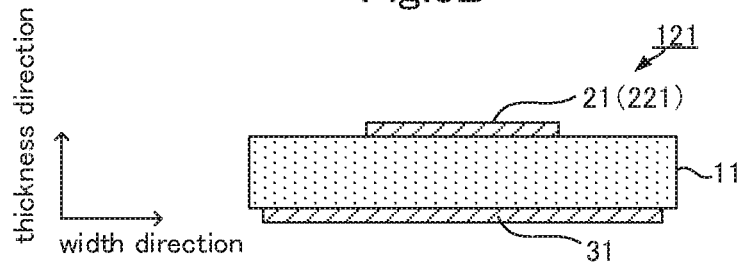
Figure 3C:
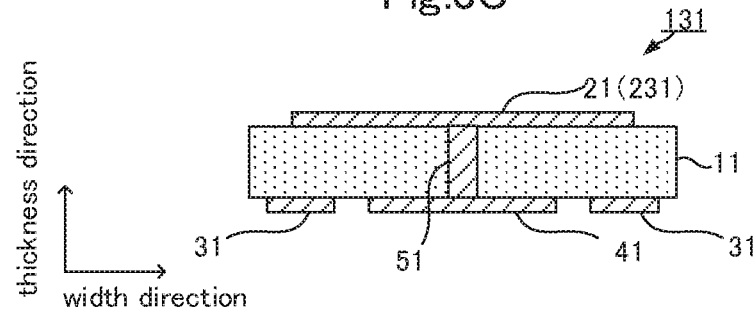

FIG. 3A is a cross-sectional view of the first portion 111 as seen from the length direction. FIG. 3B is a cross-sectional view of the second portion 121 as seen from the length direction. FIG. 3C is a cross-sectional view of the third portion 131 as seen from the length direction.

The high-frequency transmission line member 10 preferably includes a flexible substrate 11, a signal conductor 21, a ground conductor 31, land conductors 41 and 42, inter-layer connection conductors 51 and 52, and connectors 61 and 62.

The flexible substrate 11 preferably includes a single electrically insulating layer and has a strip shape that is thin in the thickness direction, is long in the length direction, is narrow in the width direction, and extends in the length direction with a uniform width or substantially uniform width. As the material of the insulating layer, a resin material having flexibility, such as a liquid crystal polymer resin or a polyethylene terephthalate resin, may be used. Each of the signal conductor 21, the ground conductor 31, and the land conductors 41 and 42 is preferably made of a planar conductor provided on the surface of the insulating layer of the flexible substrate 11. As the material of the planar conductor, for example, a copper foil may be used.

The signal conductor 21 extends in the length direction on one principal surface of the flexible substrate 11 and transmits a high-frequency signal. The ground conductor 31 extends in the length direction on the other principal surface of the flexible substrate 11 so as to face the entire surface of the signal conductor 21 and is connected to a ground potential. The inter-layer connection conductors 51 and 52 are connected to both ends of the signal conductor 21 and penetrate the flexible substrate 11 in the thickness direction. The land conductors 41 and 42 are provided on the other principal surface of the flexible substrate 11 and are connected to both ends of the signal conductor 21 via the inter-layer connection conductors 51 and 52. The connector 61 is mounted at one end of the flexible substrate 11 in the length direction and on the other principal surface of the flexible substrate 11 in the thickness direction and is electrically and mechanically connected to the land conductor 41 and the ground conductor 31. The connector 62 is mounted at the other end of the flexible substrate 11 in the length direction and on the other principal surface of the flexible substrate 11 in the thickness direction and is electrically and mechanically connected to the land conductor 42 and the ground conductor 31.

The signal conductor 21 preferably includes a first conductor portion 211 in the first portion 111. The first conductor portion 211 has an elongated shape extending in the length direction with a uniform conductor width. In addition, the signal conductor 21 includes second conductor portions 221 and 222 in the second portions 121 and 122. Each of the second conductor portions 221 and 222 preferably has an elongated shape extending in the length direction with a uniform conductor width larger than the conductor width of the first conductor portion 211. Moreover, the signal conductor 21 preferably includes third conductor portions 231 and 232 in the third portions 131 and 132. Each of the third conductor portions 231 and 232 has a quadrangular shape whose side dimensions are each larger than the conductor width of each of the second conductor portions 221 and 222. Therefore, as shown in FIGS. 3A to 3C, in the signal conductor 21 the shapes and the positions of the first portion 111, the second portion 121, and the third portion 131 are different from each other in a cross-section seen from the length direction.

The ground conductor 31 has an elongated shape extending in the length direction in the first portion 111 and the second portions 121 and 122 with a uniform conductor width larger than the conductor width of the signal conductor 21 that the ground conductor 31 faces. In addition, the ground conductor 31 preferably has a rectangular or substantially rectangular ring shape provided with cavities surrounding the land conductors 41 and 42 in the third portions 131 and 132.

The high-frequency transmission line member 10 according to the present preferred embodiment is defined as described above, and the ground conductor 31 is not provided at the one principal surface side of the signal conductor 21 but is provided only at the other principal surface side of the signal conductor 21. Therefore, in the high-frequency transmission line member 10, no ground conductor is provided at the one principal surface side of the signal conductor 21, and it is possible to form the flexible substrate 11 from a single electrically insulating layer, so that it is possible to reduce the thickness as a whole.

Since the ground conductor 31 faces only the other principal surface side of the signal conductor 21 in the high-frequency transmission line member 10, the high-frequency transmission line member 10, as a single body, defines a so-called micro stripline high-frequency transmission line that is contiguous over the first portion 111, the second portions 121 and 122, and the third portions 131 and 132. Since the ground conductor 31 is disposed on the other principal surface in the high-frequency transmission line member 10, it is possible to inhibit high-frequency noise from being radiated to the outside of the other principal surface side, or inhibit external noise from entering through the other principal surface side.

Since the high-frequency transmission line member 10 is disposed within the electronic device 9 in a state where the first portion 111 is partially close and adjacent to the housing 1 made from a metallic material as shown in FIG. 1, the housing 1 defines and functions as a ground conductor at the one principal surface side of the signal conductor 21 in the first portion 111, so that the high-frequency transmission line member 10 substantially defines a so-called stripline high-frequency transmission line.

Therefore, the configuration of the high-frequency transmission line member 10 is discontinuous between the first portion 111 and the second portions 121 and 122, so that the characteristic impedances of the first portion 111 and the second portions 121 and 122 may be different from each other. Thus, in the above configuration, by defining the first conductor portion 211, which is provided in the first portion 111 closer to the housing 1, to have a narrow conductor width and defining the second conductor portions 221 and 222, which are provided in the second portions 121 and 122 farther from the housing 1, to have a wide conductor width, a capacitance per unit length generated between the ground conductor 31 and the first conductor portion 211 in the first portion 111 is lower than a capacitance per unit length generated between the ground conductor 31 and the second conductor portions 221 and 222 in the second portions 121 and 122. Thus, even when the housing 1 is close to the first portion 111, the capacitance per unit length generated in the first conductor portion 211 is prevented from being excessive as compared to the capacitance per unit length generated in the second conductor portions 221 and 222. Accordingly, it is possible to prevent the characteristic impedance of the first portion 111 from being significantly different from those of the second portions 121 and 122, so that it is possible to enhance impedance matching between the first portion 111 and the second portions 121 and 122. Therefore, it is possible to prevent transmission loss from increasing in the high-frequency transmission line member 10.

In the present preferred embodiment, as shown in FIG. 1, the high-frequency transmission line member 10 is attached to the built-in module 2, which faces the other principal surface side of the high-frequency transmission line member 10, via the attaching member 5, and a gap with respect to the housing 1 is provided at the one principal surface side of the high-frequency transmission line member 10 at a uniform interval. Thus, a dielectric having a relative dielectric constant of about 1 is present between the high-frequency transmission line member 10 and the housing 1, so that it is possible to reduce the capacitance per unit length generated in the first conductor portion 211, even when the housing 1 is close to the first portion 111. Because of this as well, it is possible to prevent the characteristic impedance of the first portion 111 from being significantly different from those of the second portions 121 and 122. Therefore, in the case where a gap is provided at a uniform interval at the one principal surface side of the high-frequency transmission line member 10, it is made possible to set the conductor width of the first conductor portion 211 to a larger width, so that it is possible to form the signal conductor 21 to have a lower resistance. Accordingly, in the case where a gap is provided at a uniform interval at the one principal surface side of the high-frequency transmission line member 10, the conductor width of the first conductor portion 211 does not necessarily need to be narrower than the conductor width of each of the second conductor portions 221 and 222.

In the present preferred embodiment, the configuration example has been shown in which the second portions 121 and 122 and the third portions 131 and 132 are provided at both ends of the first portion 111 in the length direction, respectively. However, the second portion and the third portion may be provided only at one end side of the first portion 111 in the length direction, one of the connectors 61 and 62 may be mounted in the first portion 111, and the high-frequency transmission line member 10 may be bent only at the one end side.

In the present preferred embodiment, the configuration example has been shown in which the high-frequency transmission line member 10 is a flexible cable. However, the high-frequency transmission line member 10 may alternatively be defined by a plate-shaped general flexible substrate. In addition, the high-frequency transmission line member 10 may be defined by a rigid substrate having a bent shape in a portion thereof.

In the present preferred embodiment, the configuration example has been shown in which the one principal surface of the high-frequency transmission line member 10 faces the inner wall of the housing 1, which is made of a metallic material, and the other principal surface side of the high-frequency transmission line member 10 faces the built-in module 2. Reversely, the one principal surface side of the high-frequency transmission line member 10 may face the built-in module 2 including a metallic member, and the other principal surface side of the high-frequency transmission line member 10 may face the inner wall of the housing 1.

In the present preferred embodiment, the configuration example has been shown in which the ground conductor 31 is provided at the other principal surface side in the second portions 121 and 122. Reversely, the ground conductor 31 may be provided at the one principal surface side in the second portions 121 and 122.

Second Preferred Embodiment

Next, a high-frequency transmission line member 10A according to a second preferred embodiment of the present invention will be described with reference to the drawings. FIG. 4A is an external perspective view of one principal surface side of the high-frequency transmission line member 10A. FIG. 4B is an external perspective view of the other principal surface side of the high-frequency transmission line member 10A. FIG. 4C is an exploded perspective view of the other principal surface side of the high-frequency transmission line member 10A.

The high-frequency transmission line member 10A according to the present preferred embodiment preferably includes a first portion 111A, second portions 121A and 122A, and third portions 131A and 132A.

Figure 5A:
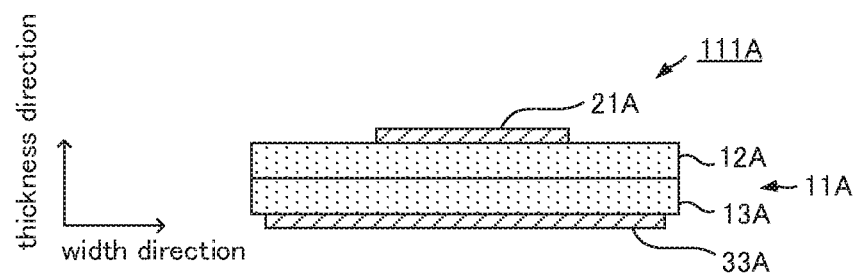
FIGS. 5A and 5B are cross-sectional views of the high-frequency transmission line member according to the second preferred embodiment of the present invention as seen from a length direction.
Figure 5B:
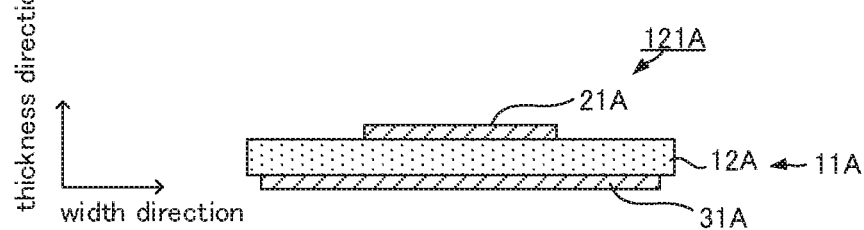
Figure 5C:
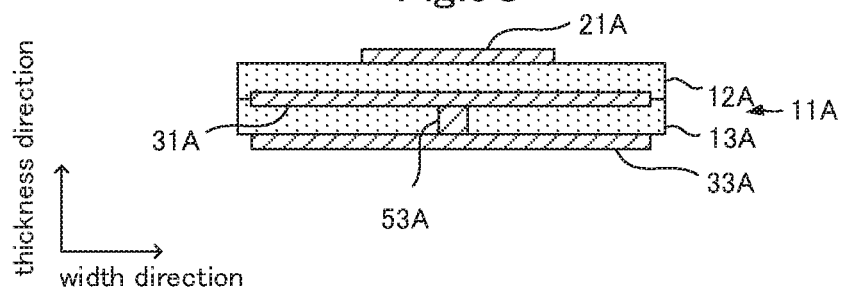
FIG. 5C is a cross-sectional view of the vicinity of a boundary in the high-frequency transmission line member according to the second preferred embodiment of the present invention as seen from the length direction.

FIG. 5A is a cross-sectional view of the first portion 111A as seen from the length direction. FIG. 5B is a cross-sectional view of the second portion 121A as seen from the length direction. FIG. 5C is a cross-sectional view of the vicinity of the boundary between the first portion 111A and the second portion 121A as seen from the length direction. The arrangement of ground conductors 31A and 32A and a ground conductor 33A in a cross-section seen from the length direction in the first portion 111A is different from that in the second portions 121A and 122A.

As shown in FIGS. 4A to 4C, the high-frequency transmission line member 10A preferably includes a flexible substrate 11A, a signal conductor 21A, the ground conductors 31A, 32A, and 33A, land conductors 41 and 42, inter-layer connection conductors 51, 52, 53A, and 54A, and connectors 61 and 62.

The flexible substrate 11A includes a first insulating layer 12A and a second insulating layer 13A and is defined such that the second insulating layer 13A is stacked at the other principal surface side of the first insulating layer 12A. The first insulating layer 12A has a shape that is contiguous over the first portion 111A, the second portions 121A and 122A, and the third portions 131A and 132A. Meanwhile, the second insulating layer 13A has a shape that overlaps almost only the first portion 111A. The total thickness of the first insulating layer 12A and the second insulating layer 13A is preferably equal or substantially equal to the thickness of the flexible substrate in the first preferred embodiment. That is, the thickness of the first portion 111A (see FIG. 5A) is equal or substantially equal to the thickness of the flexible substrate in the first preferred embodiment, but the thickness of the second portions 121A and 122A and the third portions 131A and 132A (see FIG. 5B) is smaller than the thickness of the flexible substrate in the first preferred embodiment.

The signal conductor 21A is provided on one principal surface of the first insulating layer 12A and has a shape extending in the length direction over the first portion 111A, the second portions 121A and 122A, and the third portions 131A and 132A with a uniform width or a substantially uniform width.

The ground conductor 31A is provided on the other principal surface of the first insulating layer 12A and over substantially the entire surfaces of the third portion 131A and the second portion 121A. The ground conductor 32A is provided on the other principal surface of the first insulating layer 12A and over substantially the entire surfaces of the third portion 132A and the second portion 122A. The ground conductor 33A is preferably provided over substantially the entirety of the other principal surface of the second insulating layer 13A, that is, over substantially the entire surface of the first portion 111A.

In the vicinity of the boundary between the first portion 111A and the second portion 121A (see FIG. 5C), the ground conductor 31A and the ground conductor 33A partially overlap each other in the thickness direction. In addition, in the vicinity of the boundary between the first portion 111A and the second portion 122A, the ground conductor 32A and the ground conductor 33A partially overlap each other in the thickness direction.

In the vicinity of the boundary between the first portion 111A and the second portion 121A (see FIG. 5C), the inter-layer connection conductor 53A penetrates the second insulating layer 13A to electrically connect the ground conductor 31A and the ground conductor 33A to each other. In the vicinity of the boundary between the first portion 111A and the second portion 122, the inter-layer connection conductor 54A penetrates the second insulating layer 13A to electrically connect the ground conductor 32A and the ground conductor 33A to each other.

Also in the high-frequency transmission line member 10A of the present preferred embodiment defined as described above, the ground conductors 31A, 32A, and 33A are preferably not provided at the one principal surface side of the signal conductor 21A but are provided only at the other principal surface side of the signal conductor 21A. Therefore, it is possible to reduce the thickness of the high-frequency transmission line member 10A.

In the high-frequency transmission line member 10A of the present preferred embodiment, by making the thickness of the second portions 121A and 122A and the third portions 131A and 132A smaller than the thickness of the first portion 111A, it is possible to increase the flexibility of the second portions 121A and 122A and the third portions 131A and 132A. Accordingly, it is possible to enhance workability in mounting the connectors 61 and 62 to the flexible substrate 11A or in externally connecting the connectors 61 and 62, which allows mounting work or external connection work to be easily performed.

In the high-frequency transmission line member 10A of the present preferred embodiment, by making the interval between the signal conductor 21A and the ground conductors 31A and 32A in the second portions 121A and 122A and the third portions 131A and 132A narrower than the interval between the signal conductor 21A and the ground conductor 33A in the first portion 111A, a capacitance per unit length generated in the second portions 121A and 122A and the third portions 131A and 132A is increased. Thus, in a state where a metallic member of an electronic device is close to the one principal surface side of the first portion 111A, a capacitance per unit length generated in the first portion 111A is prevented from being excessive as compared to the capacitance per unit length generated in the second portions 121A and 122A. Accordingly, it is possible to prevent the characteristic impedance of the first portion 111A from being significantly different from those of the second portions 121A and 122A, so that it is possible to enhance matching between the first portion 111A and the second portions 121A and 122A. Therefore, it is possible to prevent transmission loss from increasing in the high-frequency transmission line member 10A. In the case where the intervals between the signal conductor 21A and the ground conductors 31A, 32A, and 33A are made different between the first portion 111A and the second portions 121A and 122A, it is possible to cause the conductor width of the signal conductor 21A to be a relatively large uniform width, and this enables the signal conductor 21A to have a low resistance.

In the present preferred embodiment, the configuration example has been shown in which the signal conductor has a uniform conductor width. However, also in the present preferred embodiment, similarly to the first preferred embodiment, the conductor width of the signal conductor in the first portion may be different from that in the second portions.

Third Preferred Embodiment

Next, a high-frequency transmission line member 10B according to a third preferred embodiment of the present invention will be described with reference to the drawings. FIG. 6A is an external perspective view of one principal surface side of the high-frequency transmission line member 10B. FIG. 6B is an external perspective view of the other principal surface side of the high-frequency transmission line member 10B. FIG. 6C is an exploded perspective view of the other principal surface side of the high-frequency transmission line member 10B.

The high-frequency transmission line member 10B according to the present preferred embodiment preferably includes a first portion 111B, second portions 121B and 122B, and third portions 131B and 132B.

Figure 7A:
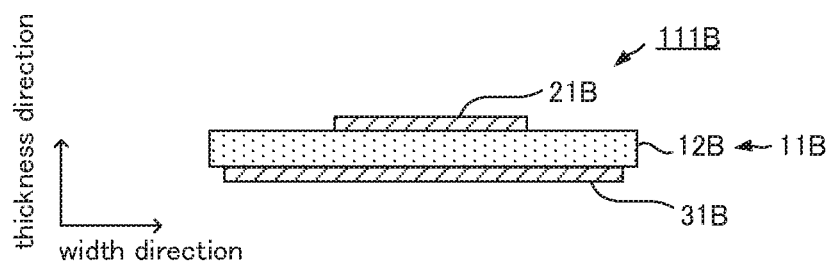
FIGS. 7A and 7B are cross-sectional views of the high-frequency transmission line member according to the third preferred embodiment of the present invention as seen from a length direction.
Figure 7B:
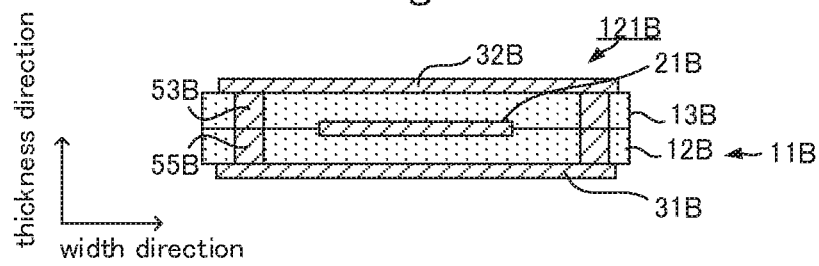

FIG. 7A is a cross-sectional view of the first portion 111B as seen from the length direction. FIG. 7B is a cross-sectional view of the second portion 121B as seen from the length direction. The arrangement of ground conductors 31B, 32B, and 33B in a cross-section seen from the length direction in the first portion 111B is different from that in the second portions 121B and 122B.

As shown in FIGS. 6A to 6C, the high-frequency transmission line member 10B includes a flexible substrate 11B, a signal conductor 21B, the ground conductors 31B, 32B, and 33B, land conductors 41 and 42 (not shown), inter-layer connection conductors 51, 52, 53B, 54B, 55B, and 56B, and connectors 61 and 62.

The flexible substrate 11B preferably includes a first insulating layer 12B and second insulating layers 13B and 14B and is structured such that the second insulating layers 13B and 14B are stacked on both end portions of the first insulating layer 12B at one principal surface side thereof. The first insulating layer 12B has a shape that is contiguous over the first portion 111B, the second portions 121B and 122B, and the third portions 131B and 132B. Meanwhile, the second insulating layers 13B and 14B have a shape that overlaps substantially only the second portions 121B and 122B and the third portions 131B and 132B.

The signal conductor 21B is provided on one principal surface of the first insulating layer 12B and has a shape extending in the length direction over the first portion 111B, the second portions 121B and 122B, and the third portions 131B and 132B with a uniform width or substantially uniform width.

The ground conductor 31B is preferably provided on substantially the entirety of the other principal surface of the first insulating layer 12B. The ground conductor 32B is provided on one principal surface of the second insulating layer 13B and over substantially the entire surfaces of the third portion 131B and the second portion 121B. The ground conductor 33B is provided on one principal surface of the second insulating layer 14B and over substantially the entire surfaces of the third portion 132B and the second portion 122B.

In the second portion 121B and the third portion 131B, the ground conductor 31B and the ground conductor 32B overlap each other in the thickness direction. In addition, in the second portion 122B and the third portion 132B, the ground conductor 31B and the ground conductor 33B overlap each other in the thickness direction.

In the second portion 121B or the third portion 131B, the inter-layer connection conductors 53B penetrate the second insulating layer 13B. In the second portion 121B or third portion 131B, the inter-layer connection conductors 55B penetrate the first insulating layer 12B. The inter-layer connection conductors 53B and the inter-layer connection conductors 55B electrically connect the ground conductor 31B and the ground conductor 32B to each other. In the second portion 122B or the third portion 132B, the inter-layer connection conductors 54B penetrate the second insulating layer 14B. In the second portion 122B or the third portion 132B, the inter-layer connection conductors 56B penetrate the first insulating layer 12B. The inter-layer connection conductors 54B and the inter-layer connection conductors 56B electrically connect the ground conductor 31B and the ground conductor 33B to each other.

In the high-frequency transmission line member 10B of the present preferred embodiment defined by described above, the ground conductors 31B, 32B, and 33B are not provided at the one principal surface side of the signal conductor 21B in the first portion 111B but are instead provided only at the other principal surface side of the signal conductor 21B in the first portion 111B. Therefore, it is possible to reduce the thickness of the first portion 111B of the high-frequency transmission line member 10B.

In the high-frequency transmission line member 10B of the present preferred embodiment, by making the thickness of the second portions 121B and 122B and the third portions 131B and 132B larger than the thickness of the first portion 111B, it is possible to enhance the robustness of the second portions 121B and 122B and the third portions 131B and 132B. Accordingly, it is possible to increase the strength of joining the connectors 61 and 62 to the flexible substrate 11B, so that it is preferably possible to prevent a joining failure or the like from occurring in the connectors 61 and 62.

In the high-frequency transmission line member 10B of the present preferred embodiment, it is possible to structure the second portions 121B and 122B and the third portions 131B and 132B as a so-called stripline high-frequency transmission line. Accordingly, a capacitance per unit length generated in the second portions 121B and 122B is increased. Therefore, in a state where a metallic member of an electronic device is close to the one principal surface side of the first portion 111B, it is possible to prevent a capacitance per unit length generated in the first portion 111B from being excessive as compared to the capacitance per unit length generated in the second portions 121B and 122B. Thus, it is possible to prevent the characteristic impedance of the first portion 111B from being significantly different from those of the second portions 121B and 122B, so that it is possible to enhance matching between the first portion 111B and the second portions 121B and 122B. Therefore, it is possible to prevent transmission loss from increasing in the high-frequency transmission line member 10B. In the case where the second portions 121B and 122B are defined by a stripline high-frequency transmission line as described above, it is possible to cause the conductor width of the signal conductor 21B to be a relatively large uniform width, and this enables the signal conductor 21B to have a low resistance. In addition, the need to make the facing interval between the signal conductor and the ground conductor in the first portion 111B different from that in the second portions 121B and 122B is reduced, so that it is possible to make the high-frequency transmission line member 10B thin as a whole. Moreover, since the second portions 121B and 122B are defined by a stripline high-frequency transmission line, the high-frequency transmission line member 10B has the ground conductors 32B and 33B also at the one principal surface side in the second portions 121B and 122B. Thus, it is possible to prevent (suppress) occurrence of unnecessary radiation from the second portions 121B and 122B to the one principal surface side.

In the present preferred embodiment, the configuration example has been shown in which the signal conductor preferably has a uniform conductor width or substantially uniform conductor width. However, also in the present preferred embodiment, similarly to the first preferred embodiment, the conductor width of the signal conductor in the first portion may be different from that in the second portions. In addition, in the present preferred embodiment, similarly to the second preferred embodiment, the flexible substrate may be formed with a plurality of insulating layers in the first portion, and the interval between the signal conductor and the ground conductors may be increased. In addition to the above, a capacitance adjustment insulating layer covering the one principal surface side of the signal conductor 21B may be additionally provided at a position between the second insulating layer 13B and the second insulating layer 14B.

Fourth Preferred Embodiment

Next, a high-frequency transmission line member 10C according to a fourth preferred embodiment of the present invention will be described with reference to the drawings. FIG. 8A is an external perspective view of one principal surface side of the high-frequency transmission line member 10C. FIG. 8B is an external perspective view of the other principal surface side of the high-frequency transmission line member 10C.

The high-frequency transmission line member 10C according to the present preferred embodiment preferably includes a first portion 111C, second portions 121C and 122C, and third portions 131C and 132C. In addition, the high-frequency transmission line member 10C includes a flexible substrate 11C, a signal conductor 21C, ground conductors 31C and 32C, land conductors 41 and 42 (not shown), inter-layer connection conductors 51 and 52, and connectors 61 and 62.

The flexible substrate 11C is preferably made of a single electrically insulating layer. The signal conductor 21C has a shape extending in the length direction over the first portion 111C, the second portions 121C and 122C, and the third portions 131C and 132C with a uniform width or substantially uniform width. The ground conductor 31C is provided on the other principal surface of the flexible substrate 11 and preferably over substantially the entire surfaces of the third portion 131C and the second portion 121C. The ground conductor 32C is provided on the other principal surface of the flexible substrate 11 and over substantially the entire surfaces of the third portion 132C and the second portion 122C.

In the high-frequency transmission line member 10C of the present preferred embodiment defined by described above, the ground conductors 31C and 32C are not provided at both the one principal surface side and the other principal surface side of the signal conductor 21C in the first portion 111C but are provided only at the other principal surface side of the signal conductor 21C in the second portions 121C and 122C and the third portions 131C and 132C. Therefore, the arrangement of the ground conductors in a cross-section seen from the length direction in the first portion 111C is preferably different from that in the second portions 121C and 122C. With such a configuration, it is possible to reduce the thickness of the high-frequency transmission line member 10C as a whole.

In the high-frequency transmission line member 10C of the present preferred embodiment, the second portions 121C and 122C are defined by a so-called stripline high-frequency transmission line, but only the signal conductor 21C is provided in the first portion 111C, the high-frequency transmission line member 10C, as a single body, does not define a high-frequency transmission line, and a stripline high-frequency transmission line is substantially defined by a metallic member of an electronic device being close to the one principal surface side of the first portion 111C. With such a configuration, in a state where the metallic member of the electronic device is close to the one principal surface side of the first portion 111C, a capacitance per unit length generated in the first portion 111C is prevented from being excessive as compared to a capacitance per unit length generated in the second portions 121C and 122C. Accordingly, it is possible to prevent the characteristic impedance of the first portion 111C from being significantly different from those of the second portions 121C and 122C, so that it is possible to enhance matching between the first portion 111C and the second portions 121C and 122C. Therefore, it is possible to prevent transmission loss from increasing in the high-frequency transmission line member 10C. In the case where the ground conductors 31C and 32C are not provided in the first portion 111C but are provided in the second portions 121C and 122C as described above, it is possible to cause the conductor width of the signal conductor 21C to be a relatively large uniform width, and this enables the signal conductor 21C to have a low resistance. Moreover, the need to make the facing interval between the signal conductor and the ground conductor in the first portion 111C different from that in the second portions 121C and 122C, and the need to dispose the ground conductors at both principal surface sides of the signal conductor in the second portions 121C and 122C, are reduced. Thus, it is possible to make a whole of the high-frequency transmission line member 10C thin.

In the present preferred embodiment, the configuration example has been shown in which the signal conductor preferably has a uniform conductor width or substantially uniform conductor width. However, also in the present preferred embodiment, similarly to the first preferred embodiment, the conductor width of the signal conductor in the first portion may be different from that in the second portions. In addition, similarly to the second preferred embodiment, a stripline high-frequency transmission line may be provided in the second portions.

Modifications of First Through Fourth Preferred Embodiments

Next, modifications of the first to fourth preferred embodiments of the present invention will be described with reference to the drawings. Here, a high-frequency transmission line member 10D according to the modification of the fourth preferred embodiment will be described. FIG. 9A is an external perspective view of one principal surface side of the high-frequency transmission line member 10D. FIG. 9B is an external perspective view of the other principal surface side of the high-frequency transmission line member 10D.

The high-frequency transmission line member 10D according to the present modification of a preferred embodiment preferably includes a first portion 111D, second portions 121D and 122D, and third portions 131D and 132D. In addition, the high-frequency transmission line member 10D includes a flexible substrate 11D, a signal conductor 21D, ground conductors 31D and 32D, inter-layer connection conductors 51, 52, 53D, and 54D, and connectors 61 and 62. Here, in the third portions 131D and 132D and the second portions 121D and 122D, the ground conductors 31D and 32D are disposed on one principal surface of the flexible substrate 11D and at both sides of the signal conductor 21D in the width direction, not on the other principal surface of the flexible substrate 11D, so as to face the signal conductor 21D with a certain interval therebetween in the width direction. The inter-layer connection conductors 53D and 54D electrically connect the ground conductors 31D and 32D to the connectors 61 and 62 in the third portions 131D and 132D.

In the high-frequency transmission line member 10D defined by described above, the second portions 121D and 122D and the third portions 131D and 132D are preferably defined by a so-called coplanar high-frequency transmission line. As described above, in a preferred embodiment of the present invention, the second portions may be defined by a coplanar high-frequency transmission line. In this case, it is possible to produce a high-frequency transmission line member by merely providing a copper foil only on a single surface of a flexible substrate and defining a pattern. Thus, it is made easy to produce the high-frequency transmission line member.

Fifth Preferred Embodiment

Figure 10A:
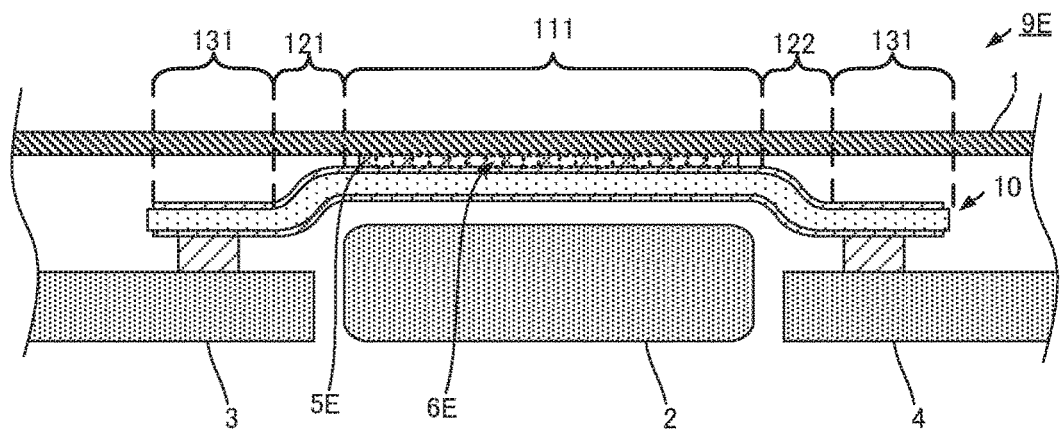
FIG. 10A is a partial cross-sectional view of an electronic device according to a fifth preferred embodiment of the present invention.
Figure 10B:
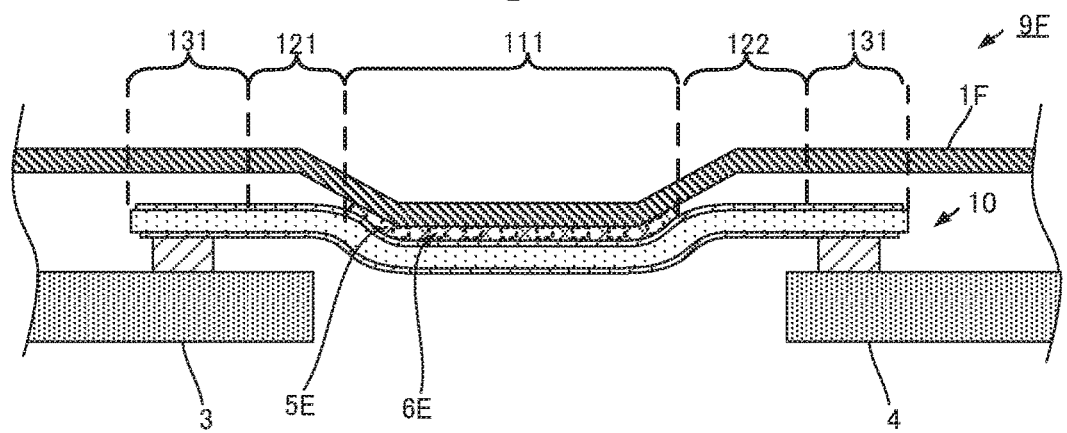
FIG. 10B is a partial cross-sectional view of an electronic device according to a modification of a preferred embodiment of the present invention.

Next, an electronic device 9E according to a fifth preferred embodiment of the present invention will be described with reference to the drawings. FIGS. 10A and 10B are partial cross-sectional views of the electronic device 9E.

The electronic device 9E preferably includes a housing 1, a built-in module 2, built-in substrates 3 and 4, an attaching member 5E, and a high-frequency transmission line member 10. The high-frequency transmission line member 10 preferably has the same configuration as shown in the first preferred embodiment, but may have the configuration shown in each of the second to fourth preferred embodiments. Here, the attaching member 5E is attached to the high-frequency transmission line member 10E and an inner wall of the housing 1 to fix the high-frequency transmission line member 10 to the inner wall of the housing 1. In addition, a plurality of cavities 6E are provided in the attaching member 5E so as to penetrate the attaching member 5E in the thickness direction and be dispersed in the width direction and the length direction. The attaching member 5E may be attached to the high-frequency transmission line member 10 and the inner wall of the housing 1 as a plurality of small-area attaching members being spaced apart from each other.

As described above, the high-frequency transmission line member 10 may be attached to the inner wall of the housing that is a metallic member. In this case, by using the attaching member 5E including the cavities 6E, it is possible to provide a gap between the high-frequency transmission line member 10 and the inner wall of the housing 1. Thus, a dielectric having a relative dielectric constant of about 1 is present between the high-frequency transmission line member 10 and the housing 1, so that it is possible to reduce the capacitance per unit length generated in the first portion 111. Because of this as well, it is possible to prevent the characteristic impedance of the first portion 111 from being significantly different from those of the second portions 121 and 122. Therefore, it is possible to set the conductor width in the first portion 111 to be thicker to provide the signal conductor 21 with a low resistance. Moreover, the need to make the facing interval between the signal conductor and the ground conductor in the first portion 111 different from that in the second portions 121 and 122, and the need to dispose the ground conductors at both principal surface sides of the signal conductor in the second portions 121 and 122, are reduced. Thus, it is possible to make the high-frequency transmission line member 10 thin as a whole.

In the case where the high-frequency transmission line member 10 is attached to the metallic member as described above, the attached surface of the metallic member may not be flat. FIG. 10B is a partial cross-sectional view of an electronic device 9F according to a modification of the fifth preferred embodiment. The electronic device 9F preferably includes a housing 1E made from a metallic material having a shape with a recess in a portion thereof. In the high-frequency transmission line member 10, the first portion 111 is attached to a projecting portion of the inner wall facing the recess of the housing 1F, with the attaching member 5E interposed therebetween.

An electronic device according to a preferred embodiment of the present invention may be defined by described above. In this case, by attaching the one principal surface side of the high-frequency transmission line member 10 directly to the metallic member, it is possible to cause the interval between the signal conductor and the metallic member to be uniform or substantially uniform at the attaching position. Therefore, it is possible to cause the characteristic impedance of the first portion 111 corresponding to the attaching position to be uniform or substantially uniform.

Sixth Preferred Embodiment

Next, an electronic device 9G according to a sixth preferred embodiment of the present invention will be described with reference to the drawings. The electronic device 9G according to the present preferred embodiment has a wireless communication function.

Figure 11:
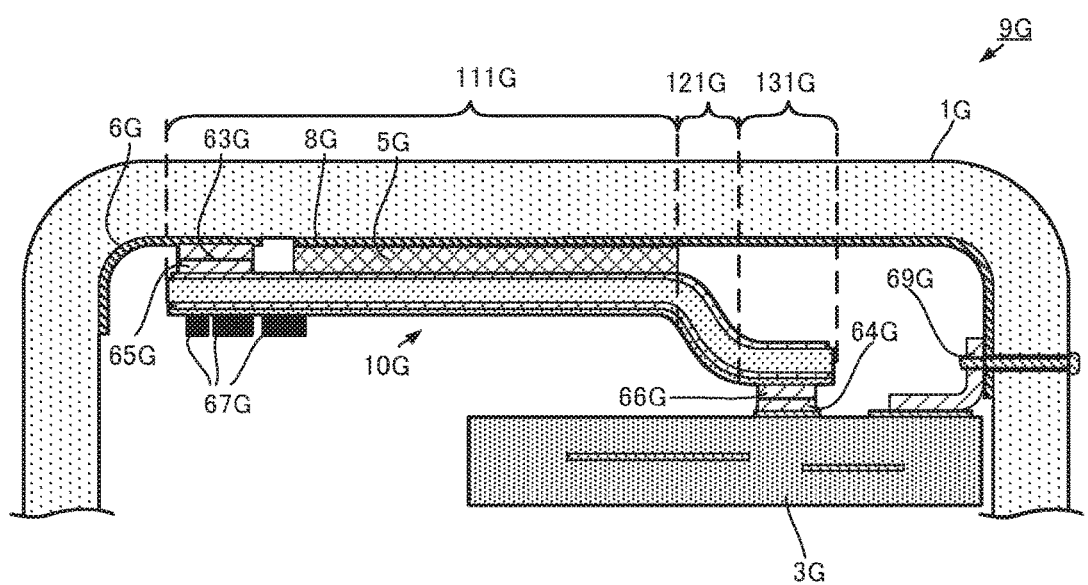
FIG. 11 is a partial cross-sectional view of an electronic device according to a sixth preferred embodiment of the present invention.

FIG. 11 is a partial cross-sectional view of the electronic device 9G. The electronic device 9G includes a housing 1G, a built-in substrate 3G, an attaching member 5G, and a high-frequency transmission line member 10G. The housing 1G preferably has a box shape having an internal space and inner walls, and is preferably made from a resin material here. The built-in substrate 3G, the attaching member 5G, and the high-frequency transmission line member 10G are housed in the housing 1G. The built-in substrate 3G is preferably mounted on the housing 1G via a mounting fitting 69G, and a principal surface thereof faces one of the inner walls of the housing 1G with a space therebetween.

On the inner wall of the housing 1G that the built-in substrate 3G faces, an antenna pattern 6G and a ground pattern 8G each made of a planar conductor are provided. The antenna pattern 6G transmits and receives wireless communication signals. The ground pattern 8G corresponds to a metallic member. In addition, the built-in substrate 3G preferably includes a frequency separator, a filter, and the like for wireless communication signals and defines an antenna front end circuit.

On the inner wall of the housing 1G that the built-in substrate 3G faces, a connector 63G is provided so as to be connected to the antenna pattern 6G. On the built-in substrate 3G, a connector 64G is provided. On the high-frequency transmission line member 10G, connectors 65G and 66G are provided at both ends thereof, respectively. The connector 65G on the high-frequency transmission line member 10G is connected to the connector 63G, which is provided on the inner wall of the housing 1G. The connector 66G on the high-frequency transmission line member 10G is connected to the connector 64G on the built-in substrate 3G. Therefore, the high-frequency transmission line member 10G electrically connects the antenna pattern 6G and the built-in substrate 3G. Here, passive element 67G are further provided on the high-frequency transmission line member 10G. The passive elements 67G defines a portion or the entirety of a matching circuit with the antenna pattern 6G.

The high-frequency transmission line member 10G also preferably includes a first portion 111G extending from one end connected to the antenna pattern 6G, along the inner wall of the housing 1G that the built-in substrate 3G faces, a third portion 131G extending from the other end connected to the built-in substrate 3G, along the principal surface of the built-in substrate 3G, and a second portion 121G bent between the first portion 111G and the third portion 131G. A portion of the first portion 111G of the high-frequency transmission line member 10G and a portion of the ground pattern 8G of the housing 1G overlap each other, and the attaching member 5G is attached to the high-frequency transmission line member 10G and the ground pattern 8G at this overlapping position.

In the electronic device 9G defined by described above, similarly to each of the other preferred embodiments, it is possible to provide a stripline or micro stripline high-frequency transmission line by using the high-frequency transmission line member 10G and a metallic member of the electronic device. In addition, in the electronic device 9G, the high-frequency transmission line member 10G is connected to the antenna pattern 6G, which is provided on the housing 1G, and the high-frequency transmission line member 10G is connected directly to the built-in substrate 3G, whereby it is possible to set a relative positional relationship between the antenna pattern 6G and the built-in substrate 3G with high flexibility in design. Moreover, even with any positional relationship between the antenna pattern 6G and the built-in substrate 3G, it is possible to cause the line length of the high-frequency transmission line connecting the antenna pattern 6G and the built-in substrate 3G to be close to a shortest line length. Thus, it is possible to reduce transmission loss occurring in the high-frequency transmission line, so that it is possible to obtain favorable communication gain in the electronic device 9G, which is a wireless communication device.

Next, the detailed configuration of the high-frequency transmission line member 10G will be described.

FIG. 12A is an exploded perspective view of one principal surface side of the high-frequency transmission line member 10G in a single body state. FIG. 12B is an exploded perspective view of the other principal surface side of the high-frequency transmission line member 10G in a single body state.

The high-frequency transmission line member 10G preferably includes a flexible substrate 11G, a resist film 12G, a signal conductor 21G, ground conductors 31G and 32G, land conductors 41G, 42G, and 43G, a plurality of inter-layer connection conductors 51G, and the connectors 65G and 66G.

The flexible substrate 11G has a strip shape extending in the length direction with a uniform width and is made of a single electrically insulating layer. The signal conductor 21G is made of a line-shaped planar conductor provided on one principal surface of the flexible substrate 11G. The ground conductor 31G is made of a planar conductor provided on substantially the entirety of the other principal surface of the flexible substrate 11G. The ground conductor 32G is made of a plurality of pad-shaped planar conductors provided on the other principal surface of the flexible substrate 11G and at portions at a position where the connector 65G is mounted. The land conductor 41G is made of a pad-shaped planar conductor provided on the other principal surface of the flexible substrate 11G and at a portion at the position where the connector 65G is mounted. The land conductor 42G is preferably made of a pad type planar conductor provided on the other principal surface of the flexible substrate 11G and at a portion at a position where the connector 66G is mounted. The land conductor 43G is preferably made of planar pad conductors provided on the other principal surface of the flexible substrate 11G and at portions at a position where the passive elements 67G are mounted. The resist film 12G is provided on substantially the entirety of the other principal surface of the flexible substrate 11G and has cavities provided so as to overlap mounting electrodes of the passive elements 67G.

The connector 65G is mounted at one end of the flexible substrate 11G in the length direction and on the one principal surface of the flexible substrate 11G in the thickness direction and is electrically and mechanically connected to the land conductor 41G and the ground conductor 32G. The connector 66G is mounted at the other end of the flexible substrate 11G in the length direction and on the other principal surface of the flexible substrate 11G in the thickness direction and is electrically and mechanically connected to the land conductor 42G and the ground conductor 31G. The passive elements 67G are mounted at the one end of the flexible substrate 11G in the length direction and on the other principal surface of the flexible substrate 11G in the thickness direction and are electrically and mechanically connected to the land conductors 43G and the ground conductor 31G. The plurality of inter-layer connection conductors 51G penetrate the flexible substrate 11G to electrically connect the planar conductor at one principal surface side of the flexible substrate 11G and the planar conductor at the other principal surface side of the flexible substrate 11G.

A ground connection end of the connector 65G is connected to the ground conductor 31G. A ground connection end of the connector 66G is connected to the ground conductor 32G. The ground conductor 31G and the ground conductor 32G are electrically connected to each other via the inter-layer connection conductors 51G. A signal line connection end of the connector 65G is connected to the land conductor 41G. A signal line connection end of the connector 66G is connected to the land conductor 42G. The passive elements 67G are connected to the land conductor 43G. The land conductor 41G and the land conductor 43G are connected to each other via the inter-layer connection conductors 51G. The land conductor 41G and another end of the signal conductor 21G are connected to each other via the inter-layer connection conductor 51G. One end of the signal conductor 21G and the land conductor 43G are connected to each other via the inter-layer connection conductor 51G. The two land conductors 43G are connected to each other via the passive element 67G. In this manner, the connector 65G and the connector 66G are electrically connected to each other via the signal conductor 21G and the passive element 67G or via the ground conductors 31G and 32G.

The signal conductor 21G includes a first conductor portion 211G in the first portion 111G. The first conductor portion 211G has an elongated shape extending in the length direction with a uniform conductor width. In addition, the signal conductor 21G includes a second conductor portion 221G in the second portion 121G and the third portion 131G. The second conductor portion 221G has an elongated shape extending in the length direction with a uniform conductor width larger than the conductor width of the first conductor portion 211G.

By providing the high-frequency transmission line member 10G of the present preferred embodiment as described above, it is possible to reduce the thickness of the high-frequency transmission line member 10G without providing a ground conductor at the one principal surface side of the signal conductor 21G. In addition, the high-frequency transmission line member 10G, as a single body, defines a micro stripline high-frequency transmission line over the first portion 111G, the second portion 121G, and the third portion 131G. Since the first portion 111G is close to the ground pattern 8G within the electronic device 9G as shown in FIG. 11, the first portion 111G substantially defines a stripline high-frequency transmission line. Therefore, by defining the first conductor portion 211G provided in the first portion 111G to have a narrow conductor width and form the second conductor portion 221G provided in the second portion 121G to have a wide conductor width, it is possible to prevent the characteristic impedance of the first portion 111G from being significantly different from that of the second portion 121G, thus providing impedance matching therebetween. Accordingly, in a state where the high-frequency transmission line member 10G is connected to the electronic device 9G, even with a configuration in which a micro stripline high-frequency transmission line and a stripline high-frequency transmission line are connected to each other, it is possible to reduce transmission loss, and thus it is also possible to obtain favorable communication gain in the electronic device 9G, which is a wireless communication device.

In the present preferred embodiment, the high-frequency transmission line member 10G preferably has the same configuration as in the first preferred embodiment or the third preferred embodiment, that is, has a configuration in which a micro stripline high-frequency transmission line and a stripline high-frequency transmission line are connected to each other. However, the high-frequency transmission line member 10G may have the same configuration as in the second preferred embodiment or the fourth preferred embodiment, that is, have a configuration in which micro stripline high-frequency transmission lines having different characteristic impedances are connected to each other. In addition, the high-frequency transmission line member 10G may have the same configuration as in the modification, that is, have a configuration in which a signal line and a coplanar high-frequency transmission line are connected to each other.

In the present preferred embodiment, the attaching member 5G preferably does not include any cavity. However, the attaching member 5G may have the same configuration as in the fifth preferred embodiment, that is, may be provided with a cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
  a high-frequency transmission line member including a substrate including an insulating layer, a planar signal conductor provided on a surface of the insulating layer and that transmits a high-frequency signal, and a planar ground conductor along the signal conductor and connected to a ground potential; and
  a metallic member defined by a member separate from the high-frequency transmission line member and located at one principal surface side of the high-frequency transmission line member; wherein
  the high-frequency transmission line member includes a first portion extending along the metallic member and facing the metallic member, and a second portion spaced apart from the metallic member more than the first portion;
  the ground conductor is not provided at one principal surface side of the signal conductor in the first portion and is provided at least in the second portion;
  only the signal conductor is provided at the one principal surface side of the high-frequency transmission line member in the first portion;
  the signal conductor provides a capacitance together with the metallic member at least in the first portion;
  the electronic device further comprises a facing member separate from the high-frequency transmission line member and located at another principal surface side of the high-frequency transmission line member, the high-frequency transmission line member being attached to the facing member; and
  the first portion and the metallic member face each other with a space therebetween.

2. The electronic device according to claim 1, wherein the signal conductor includes a first conductor width in the first portion and a second conductor width in the second portion, the first conductor width being narrower than the second conductor width.

3. The electronic device according to claim 1, wherein
  the ground conductor is provided at the another principal surface side of the signal conductor in both the first portion and the second portion; and
  an interval between the signal conductor and the ground conductor provided at the another principal surface side of the signal conductor is narrower in the second portion than in the first portion.

4. The electronic device according to claim 1, wherein the ground conductor is provided at the one principal surface side and the another principal surface side of the signal conductor in the second portion.

5. The electronic device according to claim 1, wherein a plurality of the second portions are provided, one of the plurality of second portions being provided on a first end of the first portion and another one of the plurality of the second portions being provided on a second end of the first portion.

6. The electronic device according to claim 1, wherein the high-frequency transmission line member further includes a third portion spaced apart from the metallic member more than the first portion, the third portion being connected to the first portion through the second portion.

7. The electronic device according to claim 6, wherein the ground conductor is provided on the substrate at locations opposed to each of the first portion, the second portion, and the third portion.

8. The electronic device according to claim 6, wherein the first portion and the third portion are both flat and the second portion is bent.

9. The electronic device according to claim 6, wherein the signal conductor includes a third conductor width in the third portion, the third conductor width being greater than both the first conductor width and the second conductor width.

10. An electronic device comprising:
a high-frequency transmission line member including a substrate including an insulating layer, a planar signal conductor provided on a surface of the insulating layer and that transmits a high-frequency signal, and a planar ground conductor along the signal conductor and connected to a ground potential; and
a metallic member defined by a member separate from the high-frequency transmission line member and located at one principal surface side of the high-frequency transmission line member; wherein
the high-frequency transmission line member includes a first portion extending along the metallic member and facing the metallic member, and a second portion spaced apart from the metallic member more than the first portion;
the ground conductor is not provided at one principal surface side of the signal conductor in the first portion and is provided at least in the second portion;
only the signal conductor is provided at the one principal surface side of the high-frequency transmission line member in the first portion;
the signal conductor provides a capacitance together with the metallic member at least in the first portion;
the electronic device further comprises an attaching member attached between the first portion and the metallic member; and
the attaching member at least partially fills a space between the first portion and the metallic member.

11. The electronic device according to claim 10, wherein the signal conductor includes a first conductor width in the first portion and a second conductor width in the second portion, the first conductor width being narrower than the second conductor width.

12. The electronic device according to claim 10, wherein the ground conductor is provided at the another principal surface side of the signal conductor in both the first portion and the second portion; and
an interval between the signal conductor and the ground conductor provided at the another principal surface side of the signal conductor is narrower in the second portion than in the first portion.

13. The electronic device according to claim 10, wherein a plurality of the second portions are provided, one of the plurality of the second portions being provided on a first end of the first portion and another one of the plurality of the second portions being provided on a second end of the first portion.

14. The electronic device according to claim 10, wherein the ground conductor is provided at the one principal surface side and the another principal surface side of the signal conductor in the second portion.

15. The electronic device according to claim 14, further comprising inter-layer connection conductors connecting portions of the ground conductor provided at the one principal surface side and the another principal surface side.

16. The electronic device according to claim 14, wherein the attaching member includes a plurality of cavities that penetrate the attaching member in the thickness direction.

17. The electronic device according to claim 10, wherein the high-frequency transmission line member further includes a third portion spaced apart from the metallic member more than the first portion, the third portion being connected to the first portion through the second portion.

18. The electronic device according to claim 17, wherein the ground conductor is provided on the substrate at locations opposed to each of the first portion, the second portion, and the third portion.

19. The electronic device according to claim 17, wherein the first portion and the third portion are both flat and the second portion is bent.

20. The electronic device according to claim 17, wherein the signal conductor includes a third conductor width in the third portion, the third conductor width being greater than both the first conductor width and the second conductor width.

* * * * *